(12) United States Patent
Quevy et al.

(10) Patent No.: US 8,716,815 B2
(45) Date of Patent: May 6, 2014

(54) MEMS COUPLER AND METHOD TO FORM THE SAME

(75) Inventors: Emmanuel P. Quevy, El Cerrito, CA (US); Roger T. Howe, Los Gatos, CA (US)

(73) Assignee: Silicon Laboratories Inc., Austin, TX (US)

( * ) Notice: Subject to any disclaimer, the term of this patent is extended or adjusted under 35 U.S.C. 154(b) by 158 days.

(21) Appl. No.: 12/927,312

(22) Filed: Nov. 10, 2010

(65) Prior Publication Data

US 2011/0068422 A1    Mar. 24, 2011

Related U.S. Application Data

(62) Division of application No. 11/716,227, filed on Mar. 9, 2007, now Pat. No. 7,858,422.

(51) Int. Cl.
*H01L 27/14* (2006.01)

(52) U.S. Cl.
USPC ............. 257/414; 257/416; 257/E29.167

(58) Field of Classification Search
USPC ................... 257/414, 416, E29.167
See application file for complete search history.

(56) References Cited

U.S. PATENT DOCUMENTS

| | | | |
|---|---|---|---|
| 4,838,088 A | 6/1989 | Murakami | |
| 6,846,691 B2 | 1/2005 | Hsu et al. | |
| 7,023,065 B2 | 4/2006 | Ayazi et al. | |
| 7,146,016 B2 | 12/2006 | Pedersen | |
| 7,172,917 B2 | 2/2007 | Partridge et al. | |
| 2004/0209435 A1 | 10/2004 | Partridge et al. | |
| 2005/0009233 A1 | 1/2005 | Park et al. | |
| 2005/0019974 A1* | 1/2005 | Lutz et al. | 438/52 |
| 2005/0250236 A1 | 11/2005 | Takeuchi et al. | |
| 2006/0108675 A1 | 5/2006 | Colgan et al. | |
| 2006/0273416 A1 | 12/2006 | Ayazi et al. | |
| 2007/0108513 A1 | 5/2007 | Rub et al. | |
| 2007/0111365 A1 | 5/2007 | Tateishi et al. | |
| 2008/0054759 A1 | 3/2008 | Ayazi et al. | |
| 2008/0150647 A1 | 6/2008 | Yang et al. | |
| 2008/0284544 A1* | 11/2008 | Hashimura | 333/197 |
| 2009/0108381 A1* | 4/2009 | Buchwalter et al. | 257/415 |
| 2010/0254560 A1* | 10/2010 | Mehregany | 381/361 |

OTHER PUBLICATIONS

Quevy et al., "Mems Coupler and Method to Form the Same", U.S. Appl. No. 11/716,227, filed Mar. 9, 2007, 43 pgs.

(Continued)

*Primary Examiner* — Zandra Smith
*Assistant Examiner* — Jamie C Niesz
(74) *Attorney, Agent, or Firm* — Egan, Peterman, Enders LLP.

(57) ABSTRACT

A MEMS coupler and a method to form a MEMS structure having such a coupler are described. In an embodiment, a MEMS structure comprises a member and a substrate. A coupler extends through a portion of the member and connects the member with the substrate. The member is comprised of a first material and the coupler is comprised of a second material. In one embodiment, the first and second materials are substantially the same. In one embodiment, the second material is conductive and is different than the first material. In another embodiment, a method for fabricating a MEMS structure comprises first forming a member above a substrate. A coupler comprised of a conductive material is then formed to connect the member with the substrate.

34 Claims, 13 Drawing Sheets

(56) References Cited

OTHER PUBLICATIONS

Wang et al., "1.156-GHz Self-Aligned Vibrating Micromechanical Disk Resonator", IEEE Transactions on Ultrasonics, Ferroelectrics, and Frequency Control, vol. 51, No. 12, Dec. 2004, 22 pgs.
Jahnes et al., "Simultaneous Fabrication of RF Mems Switches and Resonators Using Copper-Based CMOS Interconnect Manufacturing Methods", IEEE, 2004, 4 pgs.
Lund et al., "A Low Temperature Bi-Cmos Compatible Process for MEMS RF Resonators and Filters", Solid-State Sensor, Actuator and Microsystems Workshop, 2002, 4 pgs.
Quevy et al., U.S. Appl. No. 11/716,227, Office Action dated Nov. 7, 2008, 7 pgs.
Quevy et al., U.S. Appl. No. 11/716,227, Response to Restriction Requirement dated Dec. 4, 2008, 8 pgs.
Quevy et al., U.S. Appl. No. 11/716,227, Office Action dated Dec. 26, 2008, 17 pgs.
Quevy et al., U.S. Appl. No. 11/716,227, Amendment Under 37 CFR 1.111 dated Mar. 26, 2009, 15 pgs.
Quevy et al., U.S. Appl. No. 11/716,227, Office Action dated Apr. 28, 2009, 15 pgs.
Quevy et al., U.S. Appl. No. 11/716,227, Reply Under 37 CFR 1.116 Expedited Procedure dated Jun. 29, 2009, 15 pgs.
Quevy et al., U.S. Appl. No. 11/716,227, Advisory Action dated Jul. 17, 2009, 3 pgs.
Quevy et al., U.S. Appl. No. 11/716,227, RCE, EOT, Preliminary Amendment dated Aug. 18, 2009, 17 pgs.
Quevy et al., U.S. Appl. No. 11/716,227, Office Action dated Sep. 28, 2009, 18 pgs.
Quevy et al., U.S. Appl. No. 11/716,227, Amendment Under 37 CFR 1.111 dated Dec. 14, 2009, 15 pgs.
Quevy et al., U.S. Appl. No. 11/716,227, Office Action dated Apr. 13, 2010, 16 pgs.
Quevy et al., U.S. Appl. No. 11/716,227, RCE, Amendment and Response to Final Office Aciton Mailed Apr. 13, 2010 dated Jun. 28, 2010, 19 pgs.
Quevy et al., U.S. Appl. No. 11/716,227, Notice of Allowance and Fees Due dated Sep. 27, 2010, 12 pgs.

\* cited by examiner

MEMS COUPLER AND METHOD TO FORM THE SAME

CROSS-REFERENCE TO RELATED APPLICATIONS

This patent application is a divisional application of U.S. application Ser. No. 11/716,227, filed Mar. 9, 2007 now U.S. Pat. No. 7,858,422, the entire contents and disclosure of which is incorporated herein by reference.

FIELD OF THE INVENTION

The invention is in the field of Microelectromechanical Systems (MEMS).

BACKGROUND OF THE INVENTION

For the past several years, MEMS structures have been playing an increasingly important role in consumer products. For example, MEMS devices, such as sensors, detectors and mirrors, can be found in products ranging from air-bag triggers in vehicles to displays in the visual arts industry. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictates that the processes used to fabricate such MEMS devices need to be extremely sophisticated.

A recent fabrication challenge in the field MEMS devices is the formation of MEMs resonators. A typical MEMS resonator has at least a portion of the MEMS structure "suspended" above a substrate, i.e. not directly attached to the substrate, thus requiring some form of an anchor to couple the resonator with the underlying substrate. Two methods used to fabricate such resonators with anchors include 1) a total damascene approach and 2) an anchor-then-beam approach. Both methods, however, have their limitations.

A total damascene approach has been used to fabricate a MEMS resonator anchored to a substrate. FIGS. 1A-C illustrate a cross-sectional view representing a series of steps in a total damascene approach for fabricating a MEMS structure having a member coupled to a substrate, in accordance with the prior art.

Referring to FIG. 1A, a trench 106 consisting of a first feature 108 and a second feature 110, usually patterned in two separate steps, is patterned into release layer 104 above a substrate 102. Trench 106 is then filled with a structural layer 112, usually by blanket deposition of a material layer followed by planarization of the material layer, as depicted in FIG. 1B. Referring to FIG. 1C, release layer 104 is removed to provide a MEMS resonator 114 comprised of a resonating member 116 (formed from second feature 110 of trench 106) connected to substrate 102 by an anchor 118 (formed from first feature 108 of trench 106). One drawback to this approach is that the composition of the anchor is limited to being the same as the composition of the resonating member.

An anchor-then-beam approach has also been used to fabricate a MEMS resonator anchored to a substrate. FIGS. 2A-D illustrate a cross-sectional view representing a series of steps in an anchor-then-beam approach for fabricating a MEMS structure having a member coupled to a substrate, in accordance with the prior art.

Referring to FIG. 2A, an anchor 218 is provided in a release layer 204 above a substrate 202, either by a single-damascene technique or by subtractively forming anchor 218 and subsequently depositing and planarizing the material used to form release layer 204. A structural layer 212 is then deposited above anchor 218 and release layer 204, as depicted in FIG. 2B. Referring to FIG. 2C, structural layer 212 is patterned to form a resonating member 216 above release layer 204 and aligned with anchor 218. Release layer 204 is then removed to provide a MEMS resonator 214 comprised of resonating member 216 connected to substrate 202 by anchor 218, as depicted in FIG. 2D. One drawback to this approach is that the structural integrity of the MEMS resonator is dependent upon a single anchor/resonating member interface 220.

Thus, a MEMS coupler is described herein, along with a method to fabricate a MEMS structure having such a coupler.

DETAILED DESCRIPTION

A MEMS coupler and a method to form a MEMS structure having such a coupler are described. In the following description, numerous specific details are set forth, such as material compositions and chemical regimes, in order to provide a thorough understanding of the present invention. It will be apparent to one skilled in the art that the present invention may be practiced without these specific details. In other instances, well-known features, such as lithographic parameters and patterning procedures, are not described in detail in order to not unnecessarily obscure the present invention. Furthermore, it is to be understood that the various embodiments shown in the figures are illustrative representations and are not necessarily drawn to scale.

Disclosed herein are a MEMS coupler and a method to form a MEMS coupler. A MEMS structure may comprise a member and a substrate. In one embodiment, a coupler extends through a portion of the member and connects the member with the substrate. The member is comprised of a first material and the coupler is comprised of a second material. In one embodiment, the first material and the second material are substantially the same. In another embodiment, the second material is conductive and is different from the first material. A MEMS structure may be formed by first fabricating a member above a substrate. In one embodiment, a coupler comprised of a conductive material is subsequently formed to connect the member with the substrate.

A MEMS structure that comprises a coupler extending through a portion of a MEMS member to connect the member with a substrate may enhance the structural integrity of the MEMS structure. For example, in accordance with an embodiment of the present invention, by forming a coupler that extends through a portion of the member, as opposed to contacting only one surface of the member, the mechanical strength of the member/coupler pairing is increased. Furthermore, a MEMS structure that comprises a coupler fabricated from a conductive material to connect the member with a substrate may optimize the electrical contact formed between the MEMS structure and an electrode housed in the substrate. For example, in accordance with an embodiment of the present invention, a MEMS structure comprises a member and a coupler fabricated from substantially the same doped semiconductor material. In an alternative embodiment, the coupler of a MEMS structure is comprised of a material having greater conductivity than the material used to form the member. The electrical contact between the coupler and an electrode housed in the substrate is increased, and is thus optimized, without altering the material properties of the member. A member may be connected with a substrate subsequent to the fabrication of the member. For example, in accordance with another embodiment of the present invention, a coupler that extends through a member of a MEMS structure to connect the member with a substrate is formed by first forming the member and subsequently forming the coupler.

Figure 1A:
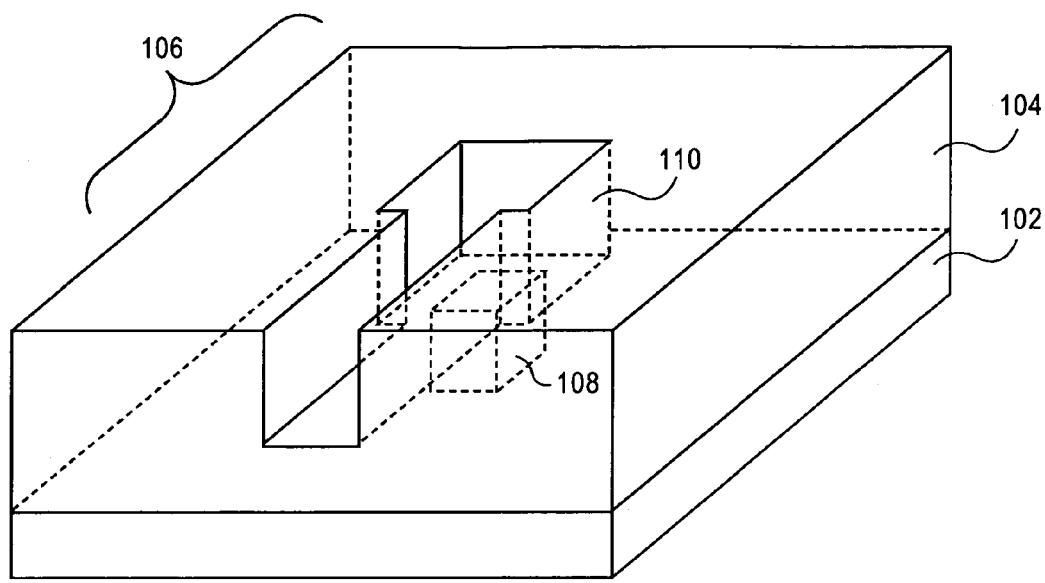
FIGS. 1A-C illustrate a cross-sectional view representing a series of steps in a total damascene approach for fabricating a MEMS structure having a member coupled to a substrate, in accordance with the prior art.
Figure 1B:
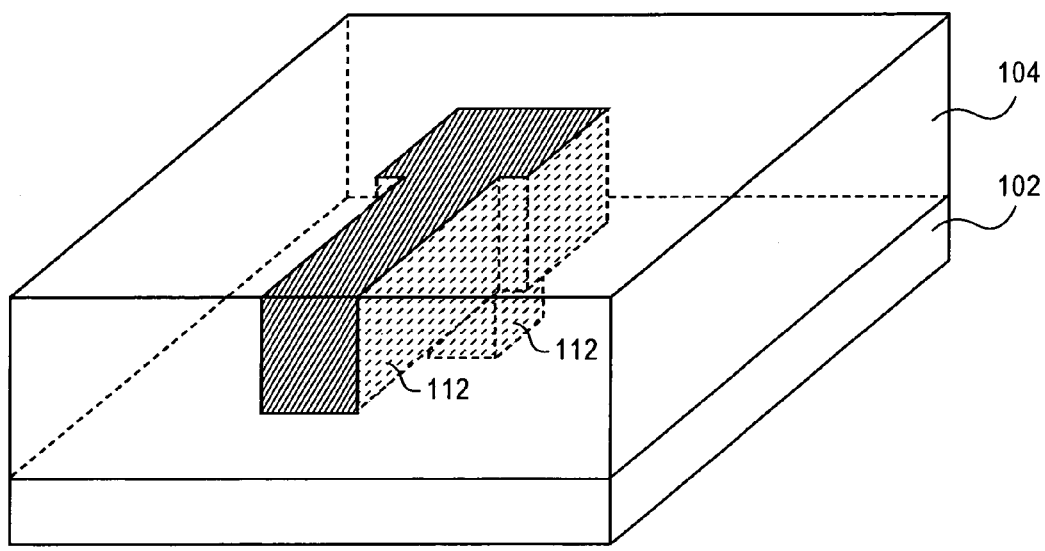
Figure 1C:
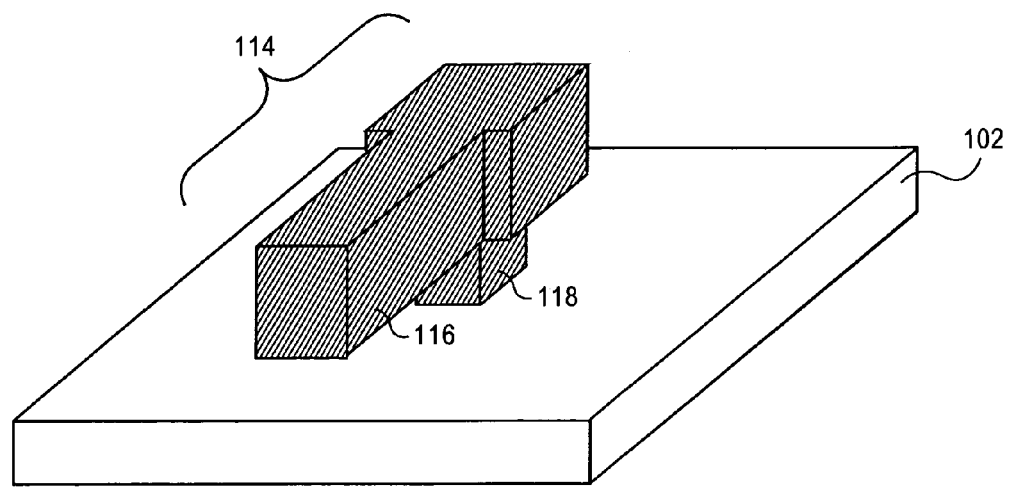
Figure 2A:
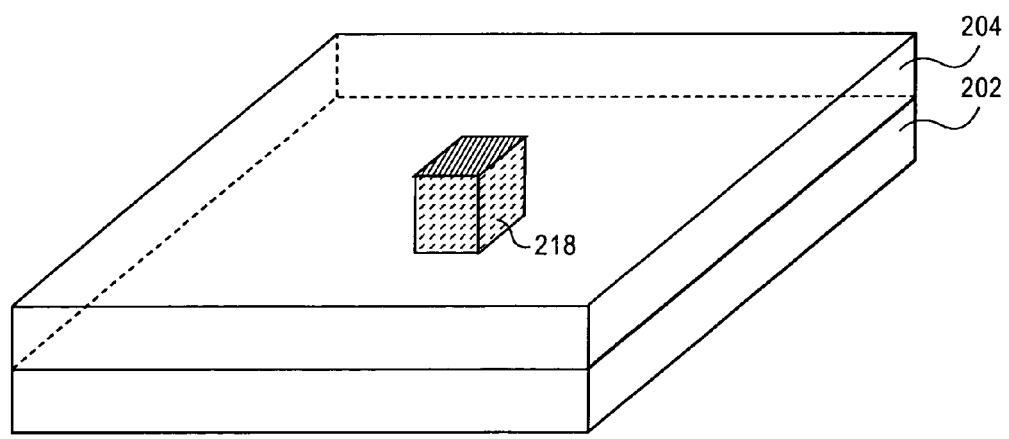
FIGS. 2A-D illustrate a cross-sectional view representing a series of steps in an anchor-then-beam approach for fabricating a MEMS structure having a member coupled to a substrate, in accordance with the prior art.
Figure 2B:
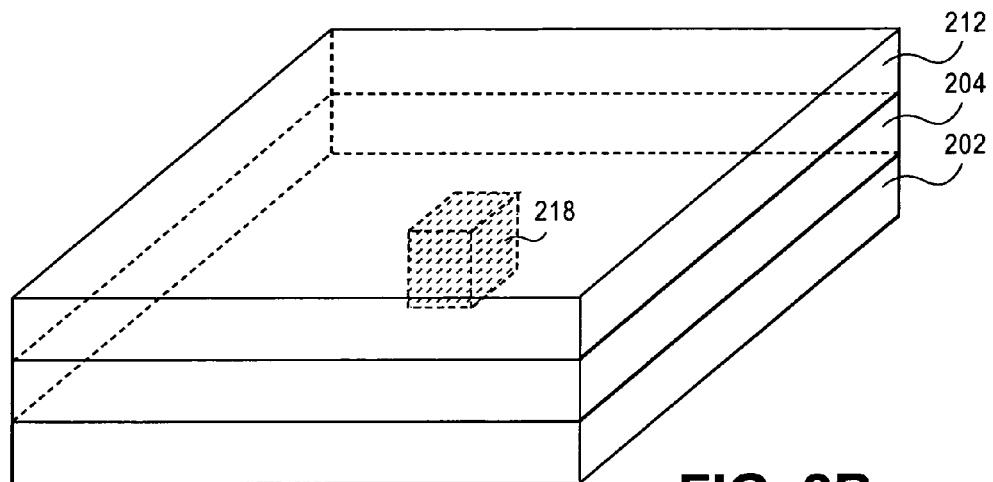
Figure 2C:
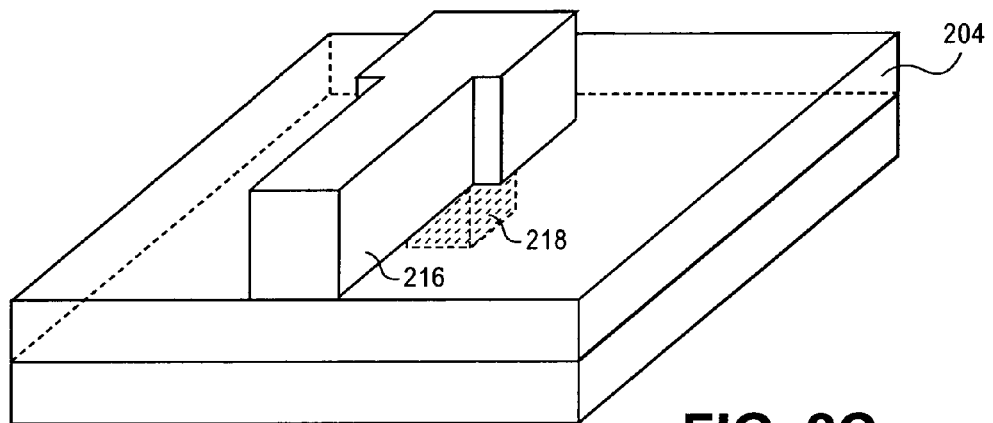
Figure 2D:
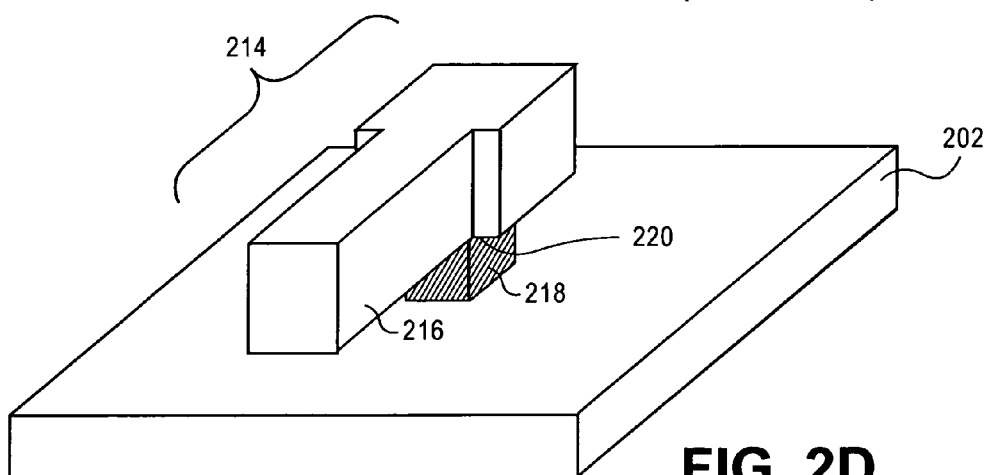
Figure 3:
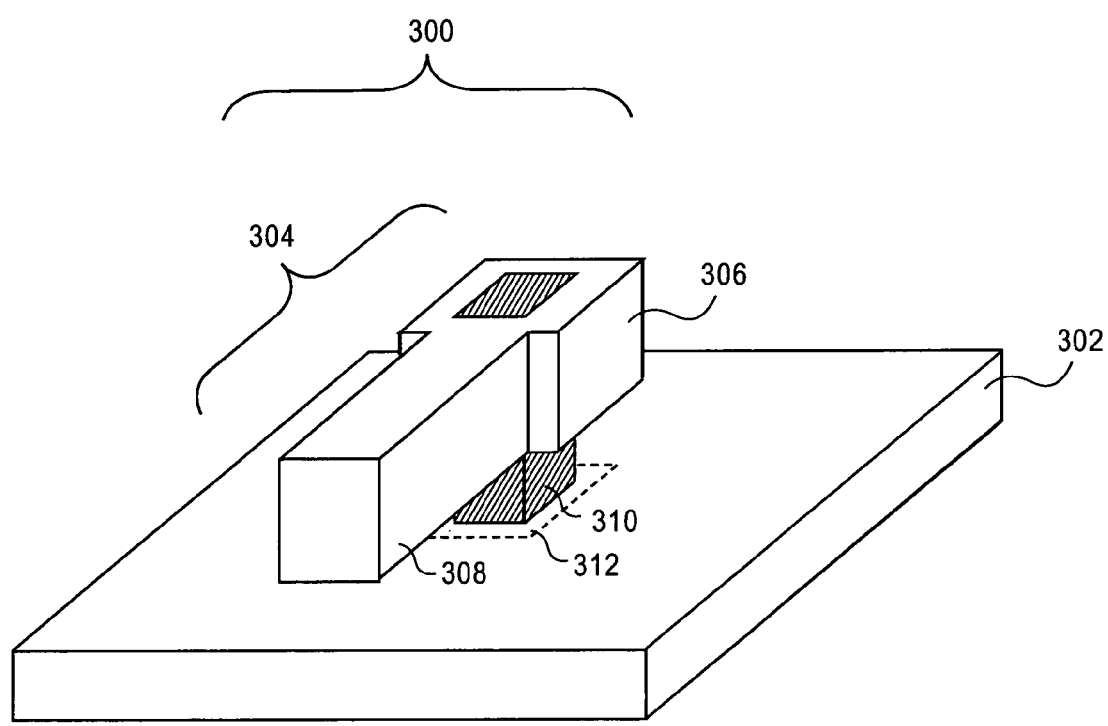
FIG. 3 illustrates a cross-sectional view representing a MEMS structure having a member connected with a substrate by a coupler, in accordance with an embodiment of the present invention.

A MEMS structure may comprise a coupler, formed from a conductive material, that extends through a portion of the MEMS member to connect the member with a substrate. FIG. 3 illustrates a cross-sectional view representing a MEMS structure having a member connected with a substrate by a coupler, in accordance with an embodiment of the present invention.

Referring to FIG. 3, a MEMS structure 300 comprises a member 304 having a base 306 and a suspended portion 308 and is connected with a substrate 302 by a coupler 310. In one embodiment, coupler 310 connects member 304 with an electrical contact 312 in substrate 302, as depicted in FIG. 3.

MEMS structure 300 may be any device that falls within the scope of MEMS technologies. For example, MEMS structure 300 may be any mechanical and electronic structure having a critical dimension of less than approximately 250 microns and fabricated using lithography, deposition, and etching processes above a substrate. In accordance with an embodiment of the present invention, MEMS structure 300 is a device selected from the group consisting of a resonator, a sensor, a detector and a mirror. In one embodiment, MEMS structure 300 is a resonator and member 304 is a resonating member. Thus, the suspended portion 308 of member 304 may be any suspended feature having a resonant frequency. For example, in an embodiment, suspended portion 308 is a feature selected from the group consisting of a beam, a plate and a tuning fork. In a specific embodiment, suspended portion 308 is a cantilever arm, as depicted in FIG. 3.

Member 304, and thus base 306 and suspended portion 308, may be formed from any material suitable to withstand a MEMS fabrication process. For example, in accordance with an embodiment of the present invention, member 304 is comprised of a material selected from the group consisting of an insulator, a semiconductor and a conductor. In one embodiment, member 304 is an insulating material and is comprised of a material selected from the group consisting of silicon dioxide, silicon nitride, silicon oxy-nitride and a high-K dielectric material. In one embodiment, member 304 is a semiconducting material and is selected from the group consisting of silicon, germanium, silicon/germanium, carbon-doped silicon, carbon-doped silicon/germanium and a III-V material. The semiconducting material may also be comprised of dopant impurity atoms. For example, in a specific embodiment, member 304 is comprised of polycrystalline silicon/germanium with a germanium atomic concentration in the range of 50-70% and boron dopant impurity atoms with a total atomic concentration in the range of $1 \times 10^{18}$-$5 \times 10^{20}$ atoms/cm$^3$. In one embodiment, member 304 is comprised of a conductor and is formed from a material selected from the group consisting of copper, aluminum, a metal alloy and a metal silicide. Member 304 may be comprised of a material that is formed by a low temperature process. Thus, in accordance with another embodiment of the present invention, member 304 is comprised of a material formed at a temperature less than approximately 450° C.

Member 304 may have any dimensions suitable for a desired MEMS function. For example, in accordance with an embodiment of the present invention, MEMS structure 300 is a resonator comprised of a cantilever arm 308. The length of member 304 is in the range of 1-250 microns and the length of cantilever arm 308 comprises a portion of the length of member 304 in the range of 50-90%. The height of member 304 is in the range of 0.1-10 microns and the width at portion 308 is in the range of 0.1-100 microns. In one embodiment, the length of member 304 is in the range of 70-90 microns, the height of member 304 is in the range of 0.5-5 microns and the width at portion 308 is in the range of 0.5-5 microns. In a specific embodiment, cantilever arm 308 is suspended at a distance in the range of 0.1-5 microns above substrate 302.

Coupler 310 may be comprised of any conductive material suitable to withstand a MEMS fabrication process. For example, in accordance with an embodiment of the present invention, coupler 310 is comprised of a material selected from the group consisting of a semiconductor material heavily doped with charge-carrier impurity atoms and a conductor. In one embodiment, coupler 310 is a heavily doped semiconducting material and is selected from the group consisting of silicon, germanium, silicon/germanium, carbon-doped silicon and a III-V material. In a specific embodiment, coupler 310 is comprised of a group IV material and is heavily doped with charge-carrier impurity atoms selected from the group consisting of boron, indium, phosphorus, arsenic and antimony. For example, in a particular embodiment, both coupler 310 and member 304 are comprised of substantially the same silicon/germanium material with a germanium atomic concentration in the range of 50-70% and boron dopant impurity atoms with a total atomic concentration in the range of $1 \times 10^{18}$-$5 \times 10^{20}$ atoms/cm$^3$. In another particular embodiment, coupler 310 is comprised of polycrystalline silicon/germanium with a germanium atomic concentration in the range of 55-95% and boron dopant impurity atoms with a total atomic concentration in the range of $1\times10^{20}$-$5\times10^{22}$ atoms/cm$^3$. In another specific embodiment, coupler 310 is comprised of a group III-V material and is heavily doped with charge-carrier impurity atoms selected from the group consisting of carbon, silicon, germanium, oxygen, sulfur, selenium and tellurium. In one embodiment, coupler 310 is comprised of a conductor and is formed from a material selected from the group consisting of copper, aluminum, a metal alloy and a metal silicide. A low temperature process may be used to form coupler 310. Thus, in accordance with another embodiment of the present invention, coupler 310 is comprised of a material formed at a temperature less than approximately 450° C. Coupler 310 may be comprised of a material having a low resistivity. For example, in one embodiment, coupler 310 is comprised of a material having a volume resistivity less than $1\times10^{-5}$ ohms·cm. In comparison with member 304, coupler 310 may be relatively more conductive than member 304. In an embodiment, coupler 310 is at least twice as conductive as member 304. In an alternative embodiment, coupler 310 is comprised of substantially the same material as member 304. In accordance with an embodiment of the present invention, coupler 310 is for electrically coupling MEMS structure 300 with substrate 302. In another embodiment, coupler 310 is for anchoring MEMS structure 300 to substrate 302.

Substrate 302 may be comprised of any material suitable to withstand a MEMS fabrication process and to provide structural integrity for MEMS structure 300. In an embodiment, substrate 302 is comprised of group IV-based materials such as crystalline silicon, germanium or silicon/germanium. In another embodiment, substrate 302 is comprised of a III-V material. Substrate 302 may also comprise an insulating layer. In one embodiment, the insulating layer is comprised of a material selected from the group consisting of silicon dioxide, silicon nitride, silicon oxy-nitride and a high-k dielectric layer. Substrate 302 may be an insulator. In one embodiment, substrate 302 consists of glass, quartz or sapphire. Substrate 302 may comprise a fabricated integrated circuit. For example, in accordance with an embodiment of the present invention, substrate 302 comprises an insulator layer above a plurality of interconnect structures connecting a plurality of micro-electronic devices, wherein MEMS structure 300 is fabricated above the insulator layer. In one embodiment, the plurality of micro-electronic devices is a plurality of N-type and P-type transistors and the plurality of interconnect structures is a plurality of metal interconnects that tie the plurality of N-type and P-type transistors into an integrated circuit. Substrate 302 may further comprise conductive electrodes that contact underlying interconnect structures. For example, in one embodiment, substrate 302 comprises an electrical contact 312 comprised of a conductive plug or via. In a particular embodiment, MEMS structure 300 comprises a coupler 310 that electrically couples member 310 with electrical contact 312, housed in substrate 302.

A MEMS coupler that extends through a portion of a MEMS member to connect the member with a substrate may be fabricated by first forming the member by a subtractive process and then forming the coupler. FIGS. 4A-E illustrate a cross-sectional view representing a series of steps for fabricating a MEMS structure having a member connected with a substrate by a coupler, in accordance with an embodiment of the present invention.

Figure 4A:
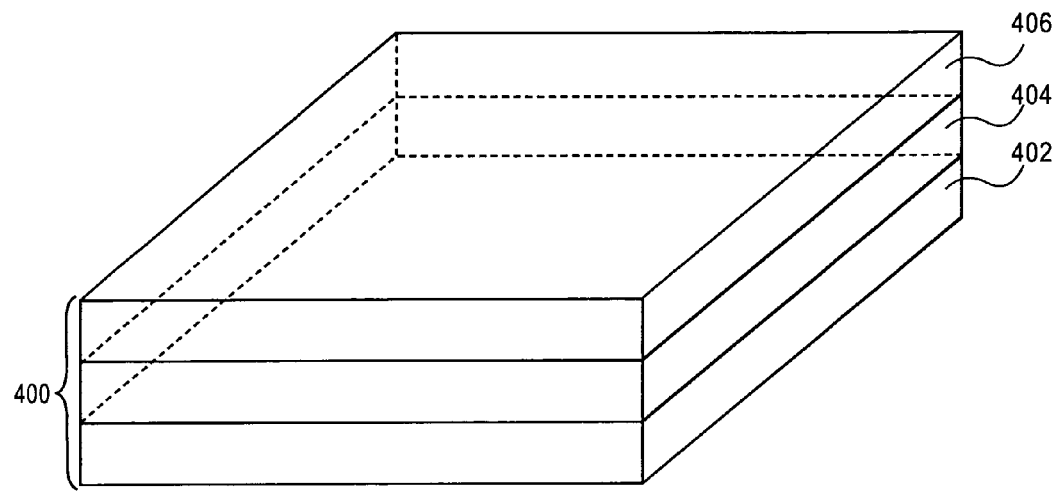
FIGS. 4A-E illustrate a cross-sectional view representing a series of steps for fabricating a MEMS structure having a member connected with a substrate by a coupler, in accordance with an embodiment of the present invention.

Referring to FIG. 4A, a stacked structure 400 is provided comprising a substrate 402, a release layer 404 and a structural layer 406. Substrate 402 and structural layer 406 may be comprised of any material and/or feature described in association with substrate 302 and member 304, respectively, from FIG. 3. The thickness of structural layer 406 may be any thickness described in association with the height of member 304 from FIG. 3. The thickness of release layer 404 may be any thickness described in association with the distance that member 304 is suspended above substrate 302, also described in association with FIG. 3.

Release layer 404 may be comprised of any material suitable to withstand a MEMS fabrication process. For example, in accordance with an embodiment of the present invention, release layer 404 is comprised of a material selected from the group consisting of an insulator and a semiconductor. In one embodiment, release layer 404 is an insulating material and is comprised of a material selected from the group consisting of silicon dioxide, silicon nitride, silicon oxy-nitride and a high-K dielectric material. In one embodiment, release layer 404 is a semiconducting material and is selected from the group consisting of silicon, germanium, silicon/germanium, carbon-doped silicon and a III-V material. The semiconducting material may also be comprised of dopant impurity atoms. For example, in one embodiment, the semiconductor material is germanium and the concentration of dopant impurity atoms is selected to optimize the germanium nucleation at a temperature in the range of 300-400° C. In a specific embodiment, release layer 404 is comprised of greater than 98% germanium atoms and boron dopant impurity atoms having a total atomic concentration in the range of $5\times10^{19}$-$5\times10^{20}$ atoms/cm$^3$. Release layer 404 may be comprised of any material that may subsequently be removed with high selectivity to structural layer 406 and substrate 402. For example, in accordance with an embodiment of the present invention, substrate 402 is comprised of a top insulator layer, structural layer 406 is comprised of silicon/germanium and release layer 404 substantially comprises germanium. In a specific embodiment, both the silicon/germanium structural layer and the germanium release layer are doped with boron dopant impurity atoms. In another embodiment, substrate 402 is comprised of a top insulator layer, structural layer 406 is comprised of silicon/germanium and release layer 404 substantially comprises silicon deposited by a low-temperature physical vapor deposition process.

Structural layer 406 and release layer 404 may be formed on substrate 402 by any suitable deposition process that generates uniform material layers of consistent composition. For example, in accordance with an embodiment of the present invention, structural layer 406 and release layer 404 are deposited by a process selected from the group consisting of chemical vapor deposition, physical vapor deposition, atomic layer deposition, electroplating and electro-less plating. Structural layer 406 and release layer 404 may be deposited by a low temperature deposition process. In a specific embodiment, substrate 402 is comprised of an insulator layer above an integrated circuit and structural layer 406 and release layer 404 are deposited by a low-pressure chemical vapor deposition process at a temperature less than 450° C.

Figure 4B:
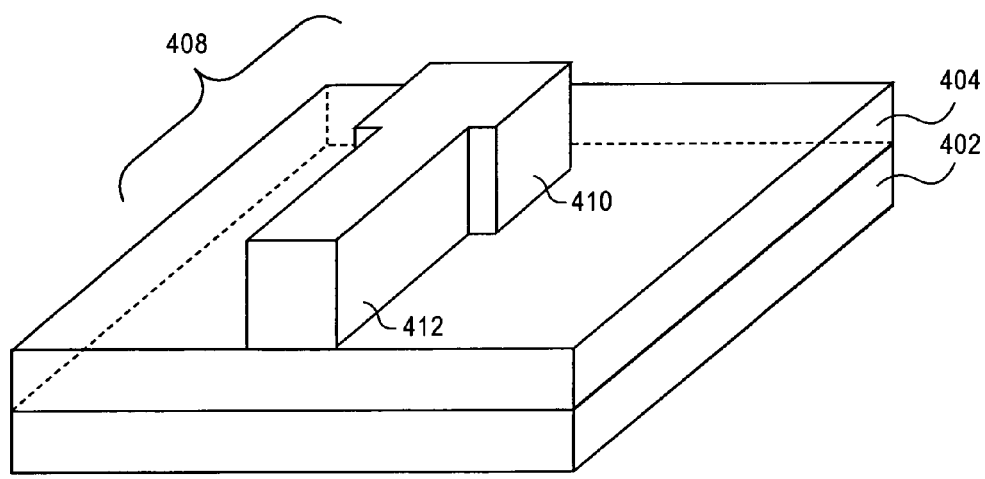

Referring to FIG. 4B, structural layer 406 is patterned to form pre-coupled member 408 comprised of a pre-base portion 410 and a pre-suspension portion 412 above release layer 404. The width and length of pre-suspension portion 412 may be any width and length described in association with suspended portion 308 from FIG. 3. Structural layer 406 may be patterned by any lithographic/etch process suitable to provide the appropriate dimensions required for pre-coupled member 408. For example, in accordance with an embodiment of the present invention, structural layer 406 is patterned by first patterning a positive photo-resist layer above structural layer 406 by exposure to a wavelength of light selected from the group consisting of 248 nm, 193 nm and 157 nm. In another embodiment, an e-beam direct-write process is used to pattern the positive photo-resist layer. An etch process may then be used to pattern structural layer 406. In one embodiment, a dry etch process is used. In a particular embodiment, structural layer 406 is comprised of silicon/germanium and the dry etch process comprises an anisotropic plasma etch process wherein the plasma is generated from gases selected from the group consisting of $SF_6$, $CF_4$ and the combination of HBr, $Cl_2$ and $O_2$. In one embodiment, a hard-mask layer is utilized in between the positive photo-resist and structural layer 406.

Figure 4C:
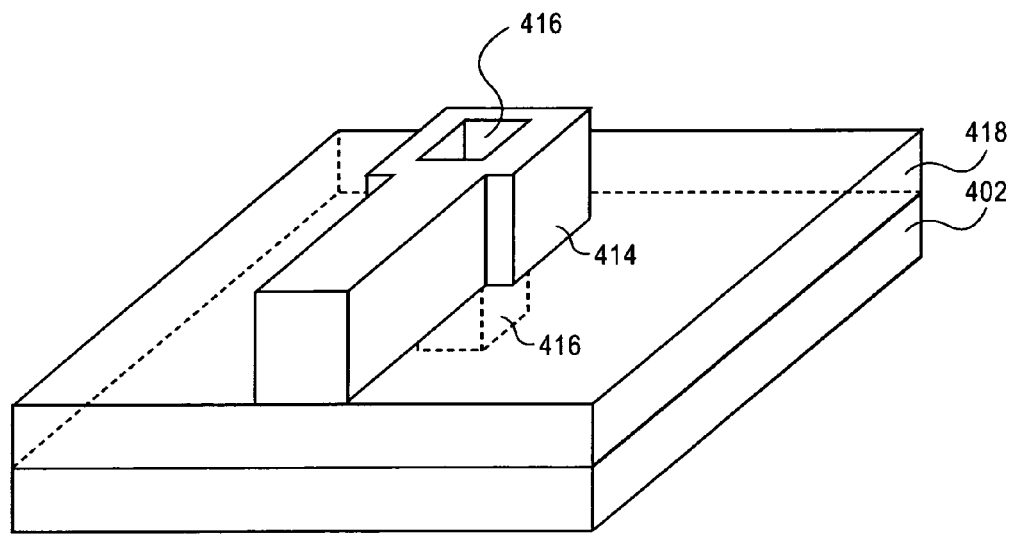

Referring to FIG. 4C, pre-base portion 410 of pre-coupled member 408 is patterned to form base portion 414 and pre-coupler hole 416 which extends through release layer 404 to form patterned release layer 418 and land on substrate 402. Pre-base portion 410 may be patterned by any lithographic/etch process used to pattern structural layer 406, described in association with FIG. 4B. It is to be understood that the precise sequence of patterning steps used to form pre-coupled member 408 and pre-coupler hole 416 may vary. For example, in accordance with another embodiment of the present invention, pre-coupled member 408 and pre-coupler hole 416 are formed in the same lithographic/etch process step. In a specific embodiment, release layer 404 is patterned to a greater extent and only the portion masked by pre-suspension portion 412 and base portion 414 is retained.

Figure 4D:
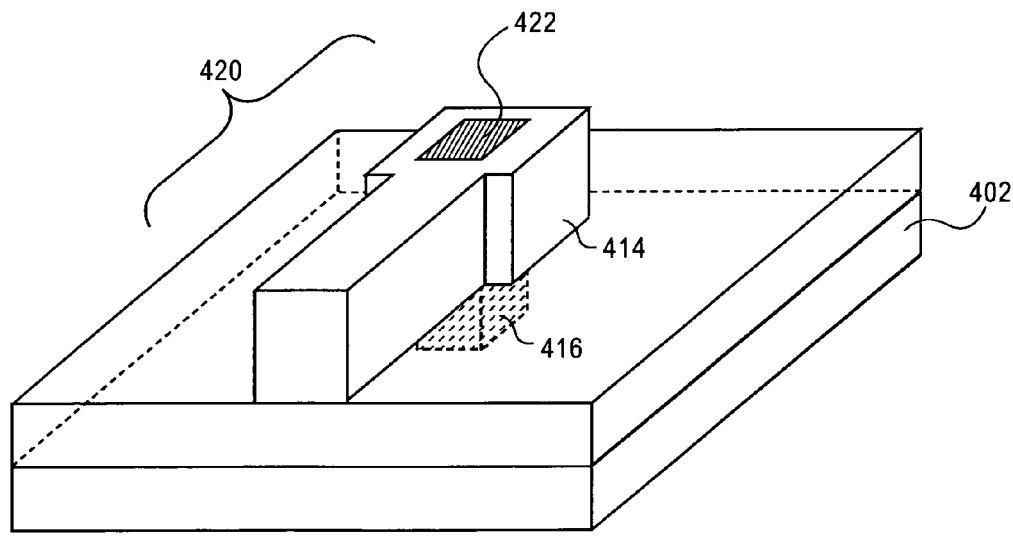

Referring to FIG. 4D, pre-coupler hole 416 is filled with a conductive material to form coupled member 420 coupled with substrate 402 via coupler 422, which extends through base portion 414. Coupler 422 may be comprised of any material described in association with coupler 310 from FIG. 3. The conductive material used to form coupler 422 may be deposited by any suitable technique that enables the formation of coupler 422 without leaving the conductive material in undesirable locations. For example, in accordance with an embodiment of the present invention, the conductive material used to form coupler 422 is blanket deposited above pre-coupled member 408 and in pre-coupler hole 416, polished back to expose the top surface of pre-coupled member 408 and, finally, masked and etched to leave only the portion that fills pre-coupler hole 416. In an alternative embodiment, pre-coupler hole 416 exposes a metallic contact region in substrate 402. The metallic contact region acts as a seed surface to form coupler 422 by a selective electroplating or electroless plating deposition process. In yet another embodiment, a lift-off approach is used wherein the conductive material used to form coupler 422 is blanket deposited in pre-coupler hole 416 and above a photo-resist mask covering pre-coupled member 408 and exposed portions of patterned release layer 418. The photo-resist mask is subsequently removed, lifting off any undesirable portions of the conductive material. In a specific embodiment, coupler 422 is formed by a low-temperature deposition process, at a temperature less than approximately 450° C.

Figure 4E:
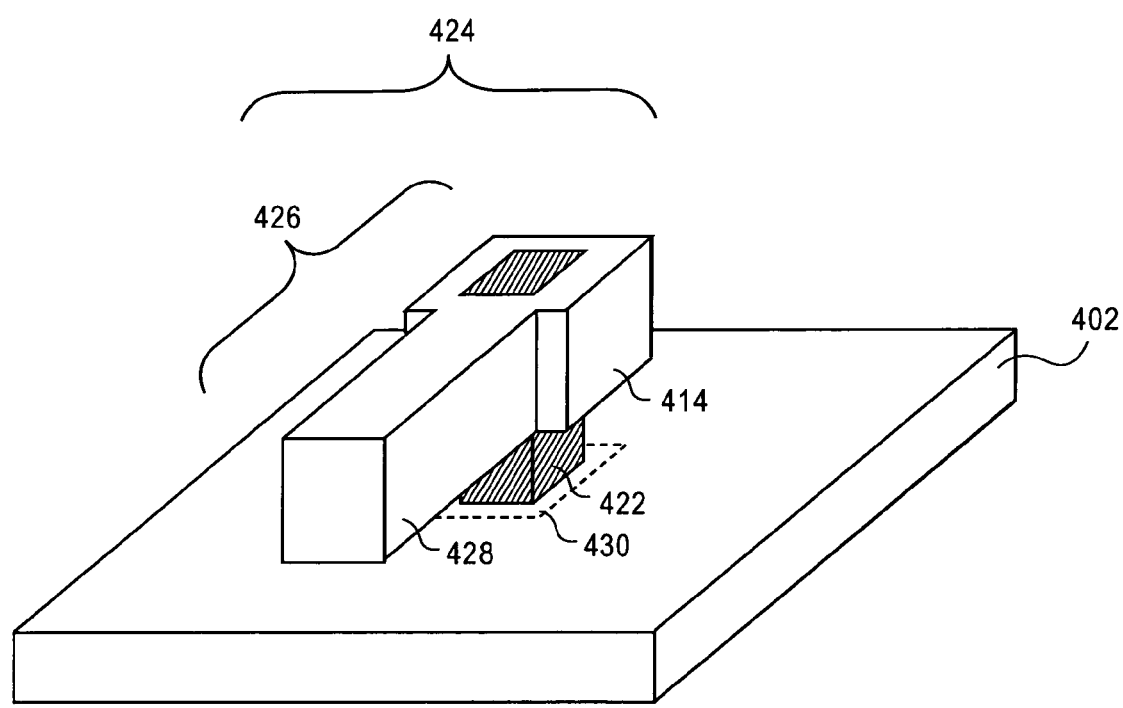

Referring to FIG. 4E, patterned release layer 418 is removed to provide MEMS structure 424 comprised of a member 426 having a suspended portion 428 and a base portion 414. Member 426 is coupled with substrate 402 by coupler 422. In accordance with one embodiment of the present invention, coupler 422 is connected with an electrical contact 430 housed in substrate 402, as depicted in FIG. 4E. Patterned release layer 418 may be removed by any technique that enables removal without significantly impacting MEMS structure 424 or substrate 402. For example, in accordance with an embodiment of the present invention, member 426 comprises silicon/germanium and patterned release layer 418 substantially comprises germanium and is removed by an oxidizing etchant. In a specific embodiment, patterned release layer 418 is comprised of germanium with an atomic concentration of greater than 98% germanium atoms and a wet etchant comprising an aqueous solution of $H_2O_2$ with a concentration in the range of 25-35% by volume and a temperature in the range of 80-95° C. is used to remove patterned release layer 418. In a particular embodiment, patterned release layer 418 is further comprised of boron dopant impurity atoms with a concentration in the range of $5\times10^{19}$-$5\times10^{20}$ atoms/cm$^3$. In accordance with another embodiment of the present invention, member 426 comprises silicon/germanium, and patterned release layer 418 substantially comprises silicon and is removed by a high pH etchant. In a specific embodiment, patterned release layer 418 is comprised of silicon with an atomic concentration of greater than 99% silicon atoms and a wet etchant comprising an aqueous solution of $NH_4OH$ with a concentration in the range of 1-20% by volume and a temperature in the range of 15-40° C. is used to remove patterned release layer 418. In a particular embodiment, patterned release layer 418 is further comprised of phosphorus and/or arsenic dopant impurity atoms with a concentration in the range of $5\times10^{18}$-$1\times10^{20}$ atoms/cm$^3$. In an embodiment, release layer 418 is removed with a selectivity greater than 20:1 over MEMS structure 424 or substrate 402.

A MEMS coupler that extends through a portion of a MEMS member to connect the member with a substrate may be fabricated by first forming the member by a damascene process and then forming the coupler. FIGS. 5A-F illustrate a cross-sectional view representing a series of steps for fabricating a MEMS structure having a member, a drive electrode and a sensor electrode, each connected with a substrate by a coupler, in accordance with an embodiment of the present invention.

Figure 5A:
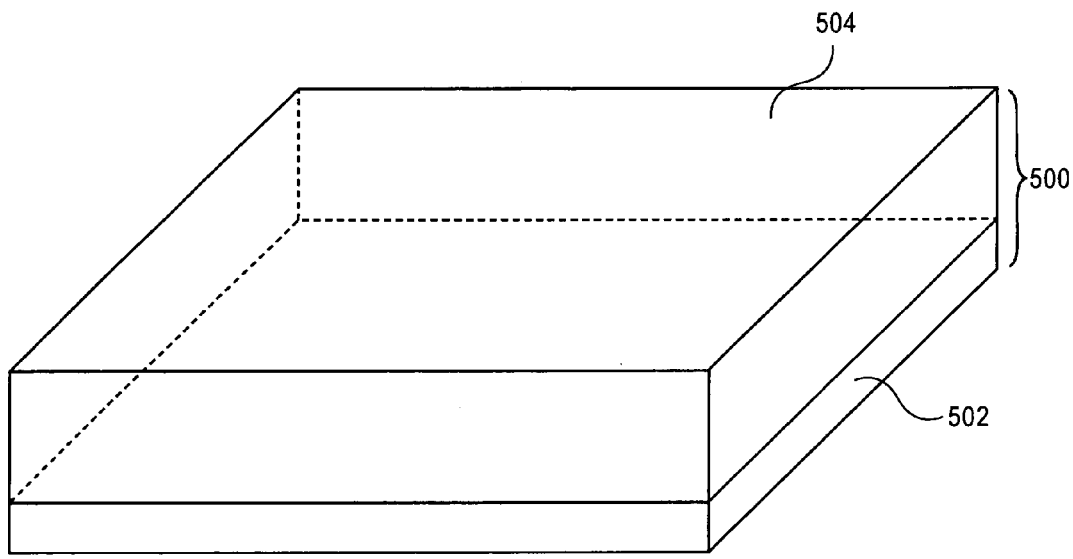
FIGS. 5A-F illustrate a cross-sectional view representing a series of steps for fabricating a MEMS structure having a member, a drive electrode and a sensor electrode, each connected with a substrate by a coupler, in accordance with an embodiment of the present invention.

Referring to FIG. 5A, a stacked structure 500 is provided comprising a substrate 502 and a release layer 504. Substrate 502 may be comprised of any material and/or feature described in association with substrate 302 from FIG. 3. Release layer 504 may be comprised of any material and deposited by any technique described in association with release layer 404 from FIG. 4A. The thickness of release layer 504 may be an additive combination of the thicknesses described in association with release layer 404 and structural layer 406 from FIG. 4A.

Figure 5B:
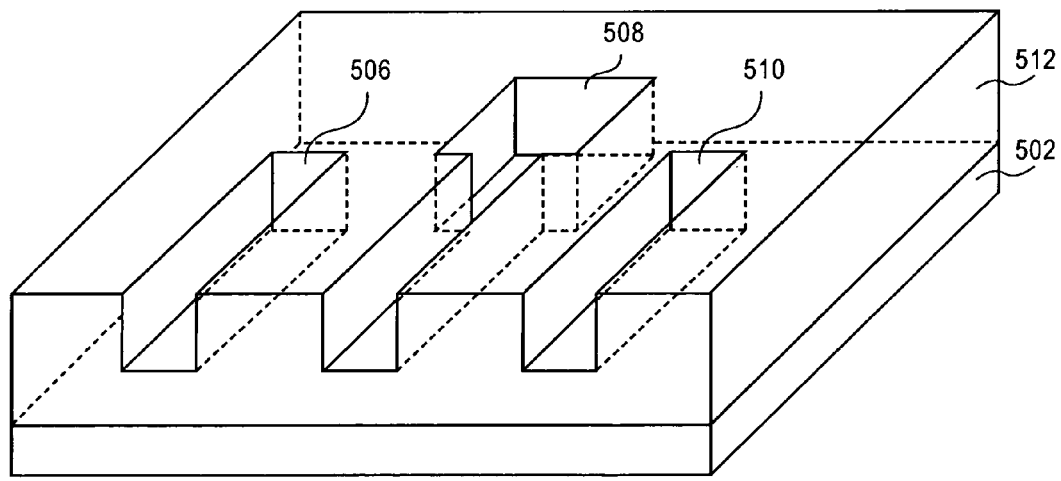

Referring to FIG. 5B, trenches 506, 508 and 510 are formed in release layer 504 to form partially patterned release layer 512 above substrate 502. Release layer 504 may be patterned by any lithographic/etch process suitable to provide appropriately sized trenches with a depth less than the thickness of release layer 504. For example, in accordance with an embodiment of the present invention, release layer 504 is patterned by first patterning a positive photo-resist layer above release layer 504 by exposure to a wavelength of light selected from the group consisting of 248 nm, 193 nm and 157 nm. In another embodiment, an e-beam direct-write process is used to pattern the positive photo-resist layer. An etch process may then be used to pattern release layer 504. In one embodiment, a dry etch process is used. In a particular embodiment, release layer 504 is comprised substantially of germanium and the dry etch process comprises an anisotropic plasma etch process wherein the plasma is generated from gases selected from the group consisting of $SF_6$, $CF_4$ and the combination of HBr, $Cl_2$ and $O_2$. In one embodiment, a hard-mask layer is utilized in between the positive photo-resist and release layer 504. The depth of the trenches 506, 508 and 510 may be any depth described in association with the height of member 304 from FIG. 3.

Figure 5C:
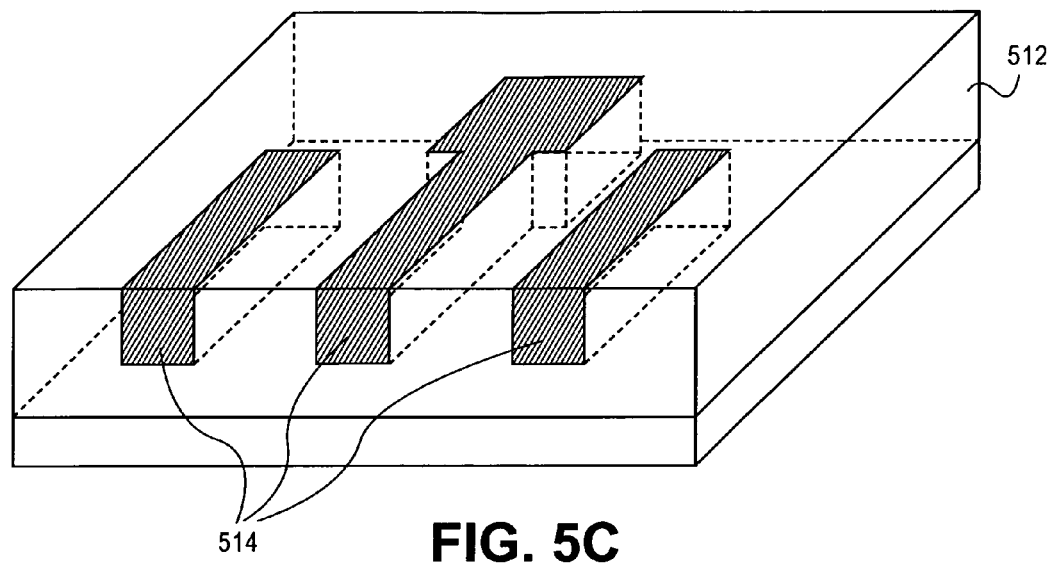

Referring to FIG. 5C, trenches 506, 508 and 510 in partially patterned release layer 512 are filled with a structural layer 514. Structural layer 514 may be comprised of material and deposited by any technique described in association with structural layer 406 from FIG. 4A. In accordance with an embodiment of the present invention, structural layer 514 is formed by first blanket depositing a material layer above partially patterned release layer 512 and in trenches 506, 508 and 510 and, subsequently, planarizing the material layer to expose the top surface of partially patterned release layer 512, as depicted in FIG. 5C.

Figure 5D:
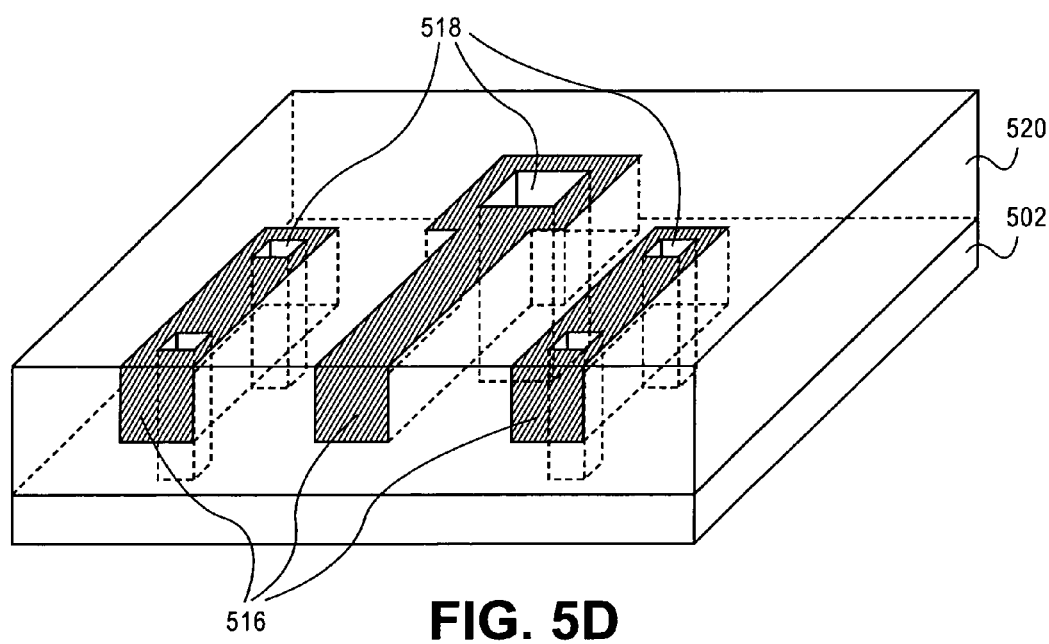

Referring to FIG. 5D, structural layer 514 is patterned to form patterned structural layer 516 having pre-coupler holes 518. Pre-coupler holes 518 extend through partially patterned release layer 512 to form patterned release layer 520 and land on substrate 502. Structural layer 514 may be patterned by any lithographic/etch process used to pattern structural layer 406, described in association with FIG. 4B, or to pattern release layer 504, described in association with FIG. 5B. In accordance with one embodiment of the present invention, pre-coupler holes 518 expose electrical contact regions housed in substrate 502.

Figure 5E:
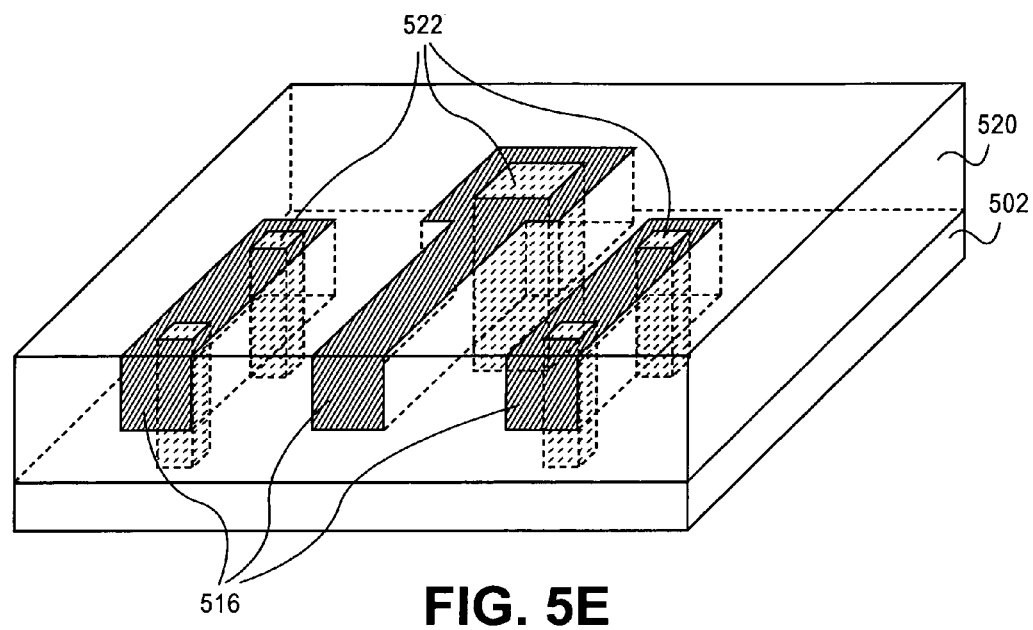

Referring to FIG. 5E, pre-coupler holes 518 are filled with a conductive material to form couplers 522 which extend through patterned structural layer 516. Couplers 522 may be comprised of any material described in association with coupler 310 from FIG. 3. The conductive material used to form couplers 522 may be deposited by any suitable technique that enables the formation of couplers 522 without leaving the conductive material in undesirable locations. For example, in accordance with an embodiment of the present invention, the conductive material used to form couplers 522 is first blanket deposited above patterned structural layer 516 and in pre-coupler holes 518 and then polished back to expose the top surface of structural layer 516. In an alternative embodiment, pre-coupler holes 516 expose metallic contact regions in substrate 502. The metallic contact regions act as a seed surface to form couplers 522 by a selective electroplating or electroless plating deposition process. In a specific embodiment, couplers 522 are formed by a low-temperature deposition process, at a temperature less than approximately 450° C.

Figure 5F:
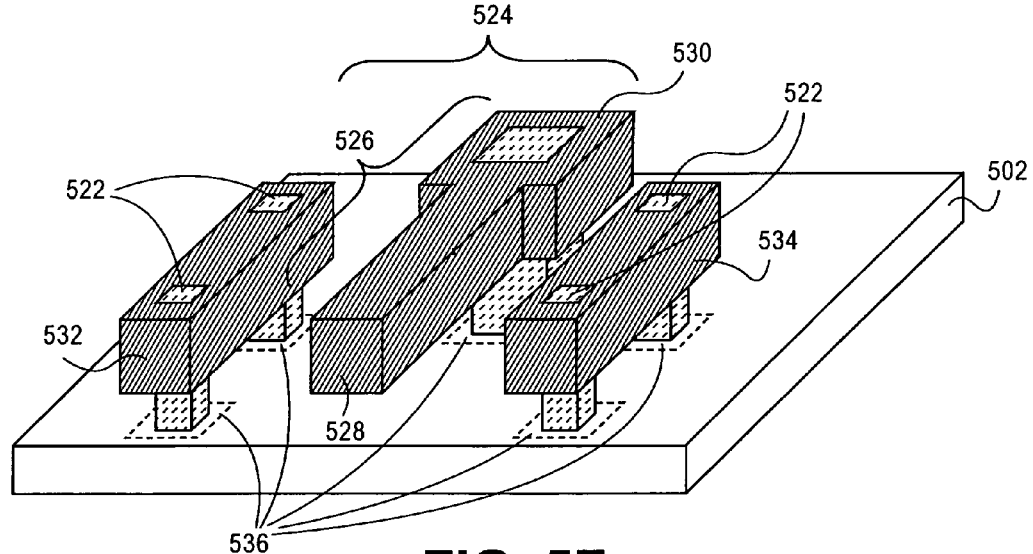

Referring to FIG. 5F, patterned release layer 520 is removed to provide MEMS structure 524 comprised of a member 526 having a suspended portion 528 and a base portion 530. Member 526 is coupled with substrate 502 by a coupler 522. A pair of electrodes comprising a drive electrode 532 and a sensor electrode 534 is also formed and is coupled with substrate 502 by couplers 522. In accordance with one embodiment of the present invention, couplers 522 are connected with electrical contacts 536 housed in substrate 502, as depicted in FIG. 5F. Patterned release layer 520 may be removed by any technique described in association with the removal of patterned release layer 418 from FIG. 4E. The spacing surrounding suspended portion 528 may be any spacing suitable to satisfy a MEMS application. For example, in accordance with an embodiment of the present invention, suspended portion 528 is suspended at a distance in the range of 0.1-5 microns above substrate 502. In one embodiment, the distance between suspended portion 528 and either of the electrodes 532 and 534 is in the range of 100-500 nanometers.

Figure 6:
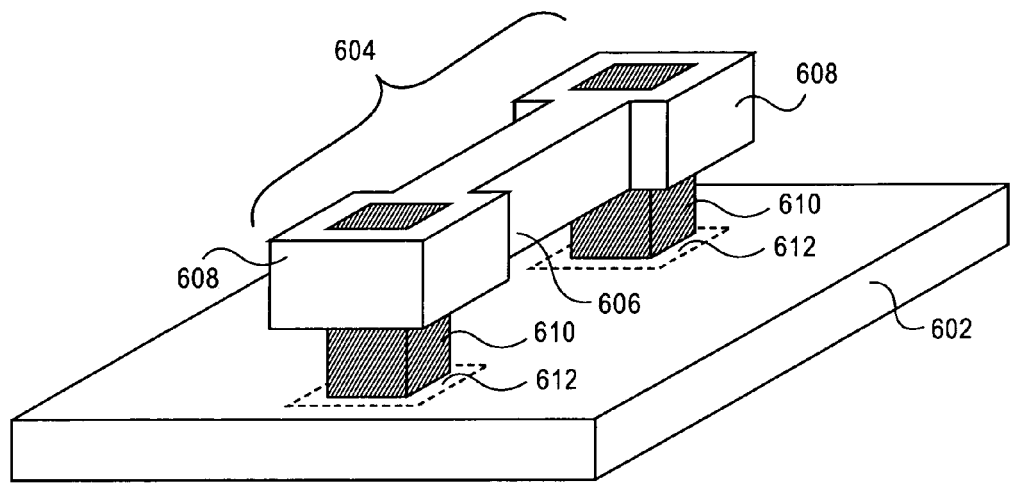
FIG. 6 illustrates a MEMS structure having a beam connected with a substrate by a coupler on either end of the beam, in accordance with an embodiment of the present invention.

A MEMS member may be coupled to a substrate at both ends of the member. FIG. 6 illustrates a MEMS structure having a beam connected with a substrate by a coupler on either end of the beam, in accordance with an embodiment of the present invention. A beam 604, having a suspended portion 606 and two base portions 608, is coupled to a substrate 602 at both ends by a pair of couplers 610. Couplers 610 extend through base portions 608. In one embodiment, couplers 610 electrically couple beam 604 with electrical contacts 612 housed in substrate 602. In another embodiment, couplers 610 are for anchoring beam 604 to substrate 602.

Figure 7:
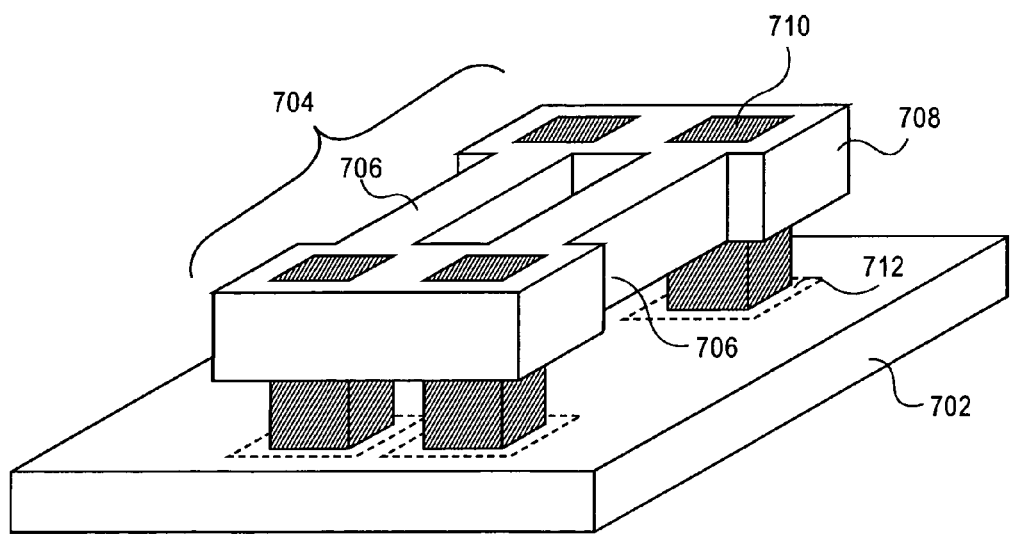
FIG. 7 illustrates a MEMS structure having a tuning fork connected with a substrate by a coupler on either end of the tuning fork, in accordance with an embodiment of the present invention.

A MEMS structure comprising more than one member may be coupled to a substrate with a MEMS coupler. FIG. 7 illustrates a MEMS structure having a tuning fork connected with a substrate by a coupler on either end of the tuning fork, in accordance with an embodiment of the present invention. A tuning fork 704 having two or more suspended portions 706 attached to a base portion 708 is coupled to substrate 702 by one or more coupler 710. Coupler 710 extends through base portion 708. In one embodiment, coupler 710 electrically couples tuning fork 704 with an electrical contact 712 housed in substrate 702. In another embodiment, coupler 710 is for anchoring tuning fork 704 to substrate 702. In a specific embodiment, tuning fork 704 is coupled with substrate 702 at both ends, as depicted in FIG. 7.

Figure 8:
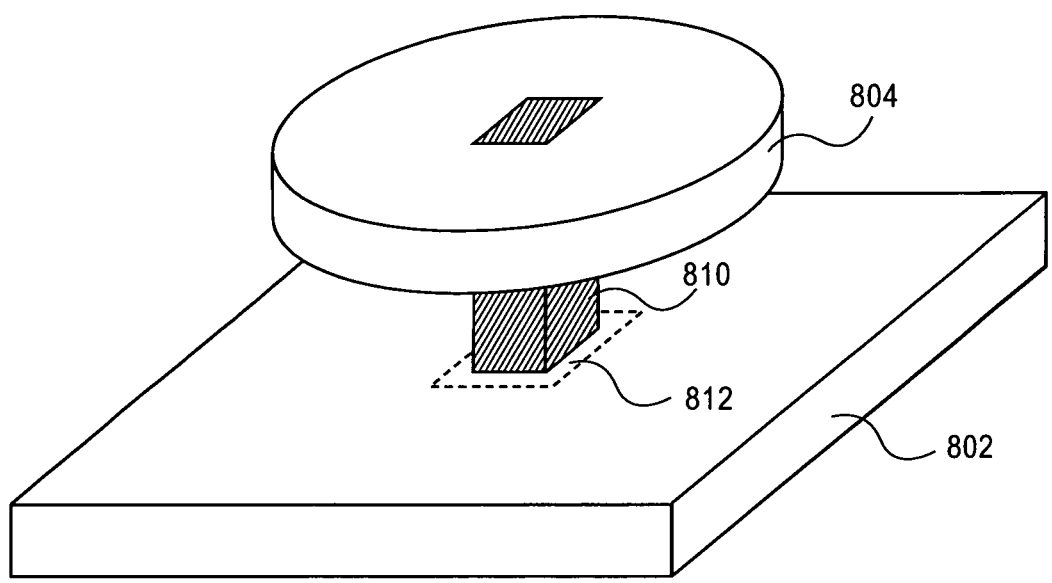
FIG. 8 illustrates a MEMS structure having a plate connected with a substrate by a coupler at the center of the plate, in accordance with an embodiment of the present invention.

A MEMS member may be coupled to a substrate at the center of the member. FIG. 8 illustrates a MEMS structure having a plate connected with a substrate by a coupler at the center of the plate, in accordance with an embodiment of the present invention. A suspended plate 804 is coupled to a substrate 802 by a coupler 810. Coupler 810 extends through the center portion of suspended plate 804. In one embodiment, coupler 810 electrically couples suspended plate 804 with an electrical contact 812 housed in substrate 802. In another embodiment, coupler 810 is for anchoring suspended plate 804 to substrate 802.

Figure 9:
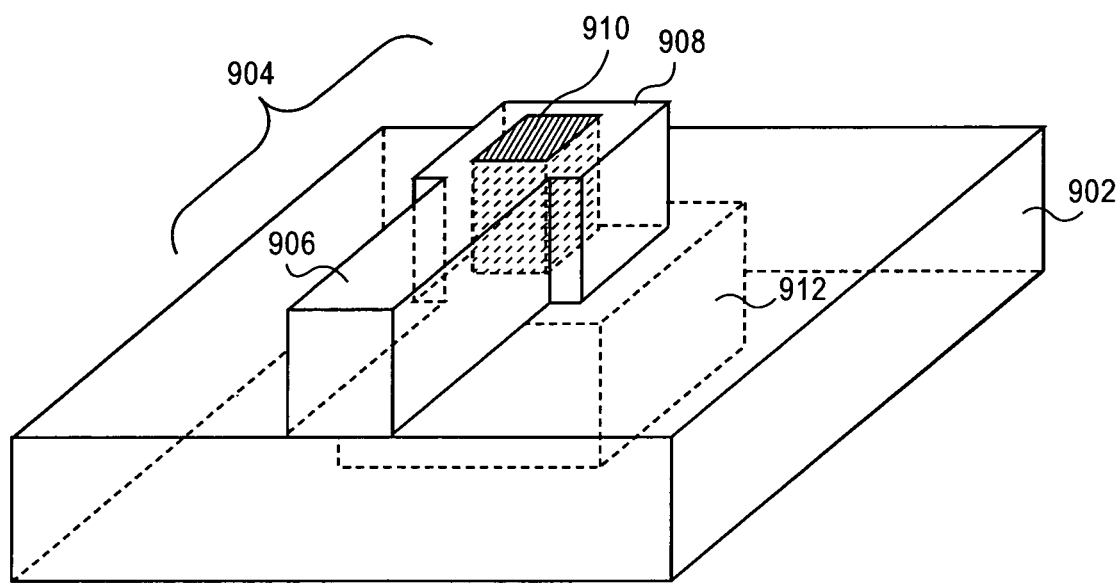
FIG. 9 illustrates a cross-sectional view representing a MEMS structure having a member electrically connected by a coupler with an electrical contact in a substrate, in accordance with an embodiment of the present invention.

A MEMS coupler may be used to electrically couple a MEMS member to a substrate but need not also anchor the member to the substrate. Thus, a release layer to suspend a portion of a MEMS structure need not be utilized, leaving the entire MEMS structure fixed to an underlying support layer. The fixed MEMS structure may therefore incorporate a coupler that electrically couples the MEMS structure to the underlying substrate, but does not necessarily provide structural anchoring support for the MEMS structure. FIG. 9 illustrates a cross-sectional view representing a MEMS structure having a member electrically connected by a coupler with an electrical contact in a substrate, in accordance with an embodiment of the present invention. A member 904, comprising and extended portion 906 and a base portion 908, is coupled by a MEMS coupler 910 with an electrical contact region 912 housed in substrate 902. Coupler 910 extends through base portion 908. Thus, in accordance with an embodiment of the present invention, a MEMS member is formed directly on a substrate and is coupled with an electrical contact in the substrate by a coupler that extends through a portion of the member. In one embodiment, the coupler 910 is formed after the fabrication of member 904.

Thus, a MEMS coupler and a method to form a MEMS structure having such a coupler have been disclosed. In one embodiment, a MEMS structure comprises a member and a substrate. A coupler extends through the member and connects the member with the substrate. The member is comprised of a first material and the coupler is comprised of a second material. In one embodiment, the first material and the second material are substantially the same. In one embodiment, the second material is conductive and is different from the first material. In accordance with another embodiment of the invention, a method for fabricating a MEMS structure comprises first forming a member above a substrate. A coupler comprised of a conductive material is then formed to connect the member with the substrate. In a specific embodiment, all process steps used to form the member and the coupler are carried out at a temperature less than approximately 450° C.

What is claimed is:

1. A MEMS structure, comprising:
   a resonating member comprised of a first material; and
   a coupler to connect said resonating member with a substrate, said coupler being formed to extend through a portion of said resonating member without said coupler being present at the top surface of a suspended portion of said resonating member and without said coupler overlying the top surface of the suspended portion of said resonating member, the top surface of said coupler essentially planar with the top surface of a suspended portion of said resonating member, and said coupler comprised of a conductive material;
   wherein said resonating member and said coupler are comprised of the same conductive polycrystalline silicon material.

2. The MEMS structure of claim 1, wherein said coupler is for electrically coupling said member with said substrate.

3. The MEMS structure of claim 1, wherein said coupler is for anchoring said member to said substrate.

4. The MEMS structure of claim 1, wherein said conductive polycrystalline silicon material is comprised of polycrystalline silicon/germanium with a germanium atomic concentration in the range of 55-95% and boron dopant impurity atoms with a total atomic concentration in the range of $1 \times 10^{20}$-$5 \times 10^{22}$ atoms/cm3.

5. The MEMS structure of claim 1, wherein said conductive polycrystalline silicon material is comprised of a material having a volume resistivity less than $1 \times 10^{-5}$ ohms.cm.

6. The MEMS structure of claim 1, wherein said suspended portion of said resonating member has a resonant frequency.

7. The MEMS structure of claim 1, wherein the resonating member and the coupler are formed such that the coupler is configured to connect the suspended portion of said resonating member as a cantilever arm that is supported at only one end or a plate disposed in spaced relationship to said substrate with a space therebetween.

8. The MEMS structure of claim 1, wherein said conductive polycrystalline silicon material is a semiconductor material heavily doped with charge-carrier impurity atoms.

9. The MEMS structure of claim 1, wherein the resonating member and the coupler are formed such that the coupler is configured to connect the suspended portion of said resonating member as a cantilever arm supported at only one end in spaced relationship to said substrate with a space therebetween.

10. The MEMS structure of claim 1, wherein said resonating member and said coupler are comprised of polycrystalline silicon/germanium with a germanium atomic concentration in the range of 50 - 70% and boron dopant impurity atoms with a total atomic concentration in the range of $1 \times 10^{18}$ 5 $\times 10^{20}$ atoms/cm$^3$.

11. A MEMS structure, comprising:
    a substrate;
    a resonating member disposed above said substrate; and
    a coupler connecting said resonating member with said substrate, said coupler extending through a portion of said resonating member without said coupler being present at the top surface of a suspended portion of said resonating member and without said coupler overlying the top surface of the suspended portion of said resonating member, the top surface of said coupler essentially planar with the top surface of the suspended portion of said resonating member, and said coupler comprised of a conductive material;
    where the resonating member of the MEMS structure is configured as a cantilever arm disposed in spaced relationship to the substrate with a space therebetween, the coupler connecting the suspended portion of said resonating member to the substrate as a cantilever arm that is supported at only one end;
    wherein said resonating member and said coupler are comprised of the same conductive polycrystalline silicon material.

12. The MEMS structure of claim 11, wherein said resonating member and said coupler are comprised of polycrystalline silicon/germanium with a germanium atomic concentration in the range of 50-70% and boron dopant impurity atoms with a total atomic concentration in the range of $1 \times 10^{-8}$-$5 \times 10^{20}$ atoms/cm3.

13. The MEMS structure of claim 11, wherein said coupler is for electrically coupling said resonating member with said substrate.

14. The MEMS structure of claim 11, wherein said coupler anchors said resonating member to said substrate.

15. The MEMS structure of claim 11, wherein said conductive polycrystalline silicon material is a semiconductor material heavily doped with charge-carrier impurity atoms.

16. The MEMS structure of claim 11, wherein said conductive polycrystalline silicon material is comprised of polycrystalline silicon/germanium with a germanium atomic concentration in the range of 55-95% and boron dopant impurity atoms with a total atomic concentration in the range of $1 \times 10^{20}$-$5 \times 10^{22}$ atoms/cm3.

17. The MEMS structure of claim 11, wherein said conductive polycrystalline silicon material has a volume resistivity less than $1 \times 10^{-5}$ ohms.cm.

18. The MEMS structure of claim 11, wherein said conductive polycrystalline silicon material is a semiconductor material heavily doped with charge-carrier impurity atoms.

19. The MEMS structure of claim 11, wherein said conductive polycrystalline silicon material is comprised of a material having a volume resistivity less than $1 \times 10^{-5}$ ohm-s.cm.

20. A MEMS structure, comprising:
    a substrate;
    a resonating member disposed above said substrate;
    a drive electrode and a sensor electrode above said substrate and on either side of said resonating member;
    a first coupler connecting said resonating member with said substrate without said first coupler being present at the top surface of a suspended portion of said resonating member and without said first coupler overlying the top surface of the suspended portion of said resonating member, the top surface of said first coupler essentially planar with the top surface of the suspended portion of said resonating member;
    a second coupler connecting said drive electrode with said substrate; and
    a third coupler connecting said sensor electrode with said substrate;
    where the resonating member of the MEMS structure has a base portion disposed at a first end of said resonating member with the suspended portion of said resonating member being disposed at a second end of said resonating member that is opposite from said first end of said resonating member; and the first coupler extends through the base portion of said resonating member to anchor the base portion of the resonating member to the substrate with the suspended portion of the resonating member forming a cantilever arm supported at only one end in spaced relationship to the substrate with a space therebetween;

wherein said resonating member and said first coupler are comprised of the same conductive polycrystalline silicon material.

21. The MEMS structure of claim 20, wherein said first, second and third couplers anchor said resonating member, drive electrode and sensor electrode to said substrate.

22. The MEMS structure of claim 20, wherein said second and third couplers electrically connect said drive electrode and sensor electrode with electrical contact regions in said substrate.

23. A MEMS structure, comprising:
a substrate;
at least one resonating member disposed above said substrate, the resonating member having a base portion and a suspended portion; and
a coupler connecting said resonating member with said substrate, said coupler extending through the base portion of said resonating member without contacting the suspended portion of said resonating member, the top surface of said coupler essentially planar with the top surface of the suspended portion of said resonating member, and said coupler comprised of a conductive material;
wherein said resonating member and said coupler are comprised of the same conductive polycrystalline silicon material; and
where the MEMS structure further comprises one of the following configurations:
the resonating member of the MEMS structure has a base portion disposed at a first end of said resonating member with the suspended portion of said resonating member being disposed at a second end of said resonating member that is opposite from said first end of said resonating member; and the coupler extends through the base portion of said resonating member to anchor the base portion of the resonating member to the substrate with the suspended portion of the resonating member forming a cantilever arm supported at only one end in spaced relationship to the substrate with a space therebetween, or
the resonating member of the MEMS structure has a base portion disposed at each of opposing first and second ends of said resonating member with the suspended portion of said resonating member being disposed between the base portions; and the coupler extends through each of the base portions of said resonating member to anchor the first and second ends of the resonating member to the substrate with the suspended portion of
the resonating member forming a suspended beam disposed in spaced relationship to the substrate with a space therebetween, or the resonating member of the MEMS structure has multiple separate suspended portions and multiple base portions disposed at each of opposing first and second ends of said resonating member, with each respective one of said multiple suspended portions being disposed between a respective opposing pair of the multiple base portions; and wherein the coupler extends through each of the multiple base portions of said resonating member to anchor the first and second ends of the resonating member to the substrate with the multiple suspended portions of the resonating member forming a tuning fork disposed in spaced relationship to the substrate with a space therebetween, or
the coupler extends through a center portion of said resonating member without contacting the suspended portion of said resonating member to anchor the center portion of the resonating member to the substrate with the suspended portion of the resonating member forming a suspended circular plate disposed around the center portion of said resonating member in spaced relationship to the substrate with a space therebetween.

24. The MEMS structure of claim 23, wherein the resonating member has a base portion disposed at a first end of said resonating member with the suspended portion of said resonating member being disposed at a second end of said resonating member that is opposite from said first end of said resonating member; and wherein the coupler extends through the base portion of said resonating member without contacting the suspended portion of said resonating member to anchor the base portion of the resonating member to the substrate with the suspended portion of the resonating member forming a cantilever arm supported at only one end in spaced relationship to the substrate with a space therebetween.

25. The MEMS structure of claim 23, wherein the resonating member has a base portion disposed at each of opposing first and second ends of said resonating member with the suspended portion of said resonating member being disposed between the base portions; and wherein the coupler extends through each of the base portions of said resonating member without contacting the suspended portion of said resonating member to anchor the first and second ends of the resonating member to the substrate with the suspended portion of the resonating member forming a suspended beam disposed in spaced relationship to the substrate with a space therebetween.

26. The MEMS structure of claim 23, wherein the resonating member has multiple separate suspended portions and multiple base portions disposed at each of opposing first and second ends of said resonating member, with each respective one of said multiple suspended portions being disposed between a respective opposing pair of the multiple base portions; and wherein the coupler extends through each of the multiple base portions of said resonating member without contacting the suspended portions of said resonating member to anchor the first and second ends of the resonating member to the substrate with the multiple suspended portions of the resonating member forming a tuning fork disposed in spaced relationship to the substrate with a space therebetween.

27. The MEMS structure of claim 23, wherein the coupler extends through a center portion of said resonating member without contacting the suspended portion of said resonating member to anchor the center portion of the resonating member to the substrate with the suspended portion of the resonating member forming a suspended circular plate disposed around the center portion of said resonating member in spaced relationship to the substrate with a space therebetween.

28. The MEMS structure of claim 23, wherein said conductive polycrystalline silicon material is a semiconductor material heavily doped with charge-carrier impurity atoms.

29. The MEMS structure of claim 23, wherein said resonating member and said coupler are comprised of polycrystalline silicon/germanium with a germanium atomic concentration in the range of 50-70% and boron dopant impurity atoms with a total atomic concentration in the range of $1 \times 10^{18}$-$5 \times 10^{20}$ atoms/cm$^3$.

30. The MEMS structure of claim 23, wherein said conductive material is comprised of polycrystalline silicon/germanium with a germanium atomic concentration in the range of 55 - 95% and boron dopant impurity atoms with a total atomic concentration in the range of $1 \times 10^{20}$ $5 \times 10^{22}$ atoms/cm$^3$.

31. The MEMS structure of claim 23, wherein said conductive material is comprised of a material having a volume resistivity less than $1 \times 10^{-5}$ ohms.cm.

32. A MEMS structure, comprising:

a resonating member comprised of a first material; and a coupler to connect said resonating member with a substrate, said coupler being formed to extend through a portion of said resonating member without said coupler being present at the top surface of a suspended portion of said resonating member and without said coupler overlying the top surface of the suspended portion of said resonating member, the top surface of said coupler essentially planar with the top surface of a suspended portion of said resonating member, and said coupler comprised of a conductive material;

wherein said resonating member and said coupler are comprised of the same materials;

wherein said conductive material is selected from the group consisting of a semiconductor material heavily doped with charge-carrier impurity atoms and a conductor; and wherein the resonating member and said coupler are each comprised of the same conductor material that is at least one of copper, aluminum, a metal alloy, a metal silicide, or a combination thereof.

33. The MEMS structure of claim 30, wherein the resonating member and said coupler are each comprised of the same conductor material that is at least one of copper, aluminum, or a combination thereof.

34. The MEMS structure of claim 30, wherein the resonating member and said coupler are each comprised of the same conductor material that is at least one of copper, aluminum, a metal alloy, or a combination thereof.

* * * * *

UNITED STATES PATENT AND TRADEMARK OFFICE
CERTIFICATE OF CORRECTION

PATENT NO.       : 8,716,815 B2
APPLICATION NO.  : 12/927312
DATED            : May 6, 2014
INVENTOR(S)      : Emmanuel Quevy et al.

It is certified that error appears in the above-identified patent and that said Letters Patent is hereby corrected as shown below:

In the Claims

In claim 4, column 11, line 31, delete "1×102o-5×1022 atoms/cm3." and insert -- $1 \times 10^{20} - 5 \times 10^{22}$ atoms/cm$^3$. --

In claim 5, column 11, line 34, delete "1×10-5 ohms.cm." and insert -- $1 \times 10^{-5}$ ohms·cm. --

In claim 10, column 11, lines 56-57, delete "$1 \times 10^{18}$  $5 \times 10^{20}$ atoms/cm$^3$" and insert -- $1 \times 10^{18} - 5 \times 10^{20}$ atoms/cm$^3$. --

In claim 12, column 12, line 18, delete "$1 \times 10$~8- $5 \times 102$o atoms/cm3" and insert -- $1 \times 10^{18} - 5 \times 10^{20}$ atoms/cm$^3$ --

In claim 16, column 12, line 32, delete "$1 \times 102$o- $5 \times 1022$ atoms/cm3" and insert -- $1 \times 10^{20} - 5 \times 10^{22}$ atoms/cm$^3$. --

In claim 17, column 12, line 35, delete "$1 \times 10$-5 ohms.cm." and insert -- $1 \times 10^{-5}$ ohms·cm. --

In claim 19, column 12, lines 41-42, delete "$1 \times 10$-5 ohms.cm." and insert -- $1 \times 10^{-5}$ ohms·cm. --

In claim 30, column 15, lines 5-6, delete "$1 \times 10^{20}$  $5 \times 10^{22}$ atoms/cm$^3$." and insert -- $1 \times 10^{20} - 5 \times 10^{22}$ atoms/cm$^3$ --

In claim 31, column 15, line 9, delete "1×10-¯5 ohms.cm." and insert -- $1 \times 10^{-5}$ ohms· cm. --

Signed and Sealed this
Eighth Day of July, 2014

Michelle K. Lee
*Deputy Director of the United States Patent and Trademark Office*